(12) United States Patent
Na et al.

(10) Patent No.: US 9,653,269 B2
(45) Date of Patent: May 16, 2017

(54) DETECTING ARCING USING PROCESSING CHAMBER DATA

(71) Applicant: Applied Materials, Inc., Santa Clara, CA (US)

(72) Inventors: Shuo Na, Sunnyvale, CA (US); Kelby Yancy, Forney, TX (US); Chunsheng Chen, Tianjin (CN); Ilias Iliopoulos, Foster City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 240 days.

(21) Appl. No.: 14/459,152

(22) Filed: Aug. 13, 2014

(65) Prior Publication Data

US 2015/0048862 A1 Feb. 19, 2015

Related U.S. Application Data

(60) Provisional application No. 61/866,024, filed on Aug. 14, 2013.

(51) Int. Cl.
*G01R 31/02* (2006.01)
*H01J 37/32* (2006.01)
*G01R 31/24* (2006.01)
*G01R 31/12* (2006.01)

(52) U.S. Cl.
CPC ........ *H01J 37/32944* (2013.01); *G01R 31/12* (2013.01); *G01R 31/245* (2013.01); *H01J 2237/0225* (2013.01); *H01J 2237/24592* (2013.01)

(58) Field of Classification Search
CPC  G01R 31/08; G01R 31/2831; G01R 31/2884; G01R 31/2648; H01L 22/14; H01L 22/12; H01L 22/20; H01L 22/34; H01J 37/32917; H01J 37/32935; H01J 37/3299; H01J 37/32926; H01J 37/32972
See application file for complete search history.

(56) References Cited

U.S. PATENT DOCUMENTS

| 6,913,938 | B2 * | 7/2005 | Shanmugasundram | C23C 16/52 |
| | | | | 257/E21.525 |
| 7,902,991 | B2 * | 3/2011 | Park ................. | H01J 37/32174 |
| | | | | 315/111.21 |
| 2007/0284246 | A1 * | 12/2007 | Keil ..................... | C23C 16/509 |
| | | | | 204/298.36 |
| 2009/0308734 | A1 * | 12/2009 | Krauss .............. | H01J 37/32935 |
| | | | | 204/192.13 |
| 2013/0245969 | A1 * | 9/2013 | Singlevich ........ | H01J 37/32917 |
| | | | | 702/58 |

FOREIGN PATENT DOCUMENTS

JP   2005150555 A  *  6/2005

* cited by examiner

*Primary Examiner* — Minh N Tang
(74) *Attorney, Agent, or Firm* — Patterson + Sheridan, LLP (57) ABSTRACT

A method and apparatus for detecting substrate arcing and breakage within a processing chamber is provided. A controller monitors chamber data, e.g., parameters such as RF signals, voltages, and other electrical parameters, during operation of the processing chamber, and analyzes the chamber data for abnormal spikes and trends. Using such data mining and analysis, the controller can detect broken substrates without relying on glass presence sensors on robots, but rather based on the chamber data.

23 Claims, 4 Drawing Sheets

DETECTING ARCING USING PROCESSING CHAMBER DATA

CROSS-REFERENCE TO RELATED APPLICATIONS

This Application claims the benefit of U.S. Provisional Application No. 61/866,024 filed on Aug. 14, 2013, which is incorporated by reference in its entirety.

BACKGROUND

Field

Embodiments of the present disclosure generally relate to a method for detecting arcing and related breakage events within processing chambers.

Description of the Related Art

In semiconductor manufacturing, the production processing equipment used must be controlled such that its variables stay within certain operational limits. These limits can be very narrow and typically vary throughout the different steps, stages or phases of the process. Failure to remain within these operational limits during processing can easily cause the loss of, or damage to, the device and/or wafer being processed.

In some cases, the substrate being processed may suffer a breakage during processing. In other cases, a severe arc or multiple arcs may occur. In these cases, the substrate being processed has to be discarded, resulting in loss of production and costly downtime, and may even affect later-processed substrates if not properly detected. For example, a small piece of the substrate may be left behind in the chamber without being detected, resulting in every substrate that was processed with the small piece of the substrate in the chamber having to be discarded as well.

SUMMARY

Embodiments of the present disclosure provide methods for operating a processing chamber, including for example, detecting substrate arcing or breakage. The method includes generating a threshold value associated with a first chamber parameter according to historical chamber data obtained during processing of prior substrates in the processing chamber. The method further includes receiving the first chamber parameter during processing of a first substrate according to a stage of a recipe, and determining at least one of a breakage exists in the first substrate or arcing has occurred in the processing chamber while processing the first substrate in response to determining the first chamber parameter exceeds the threshold value Another embodiment of the present disclosure provides a computer-readable storage medium storing a program, which, when executed by a processor performs an operation for operating a processing chamber. The operation includes generating a threshold value associated with a first chamber parameter according to historical chamber data obtained during processing of prior substrates in the processing chamber, and receiving the first chamber parameter during processing of a first substrate according to a stage of a recipe. The operation further includes determining at least one of a breakage exists in the first substrate or arcing has occurred in the processing chamber while processing the first substrate in response to determining the first chamber parameter exceeds the threshold value Another embodiment of the present disclosure provides a controller for a processing chamber, which includes a system memory and a processor. The processor is programmed to carry out the stages of receiving historical chamber data obtained during processing of prior substrates in the processing chamber, and generating a threshold value associated with a first chamber parameter according to the historical chamber data. The processor is further configured to carry out the stages of receiving the first chamber parameter during processing of a first substrate according to a stage of a recipe, and determining arcing has occurred between the processing chamber and the first substrate in response to determining the first chamber parameter exceeds the threshold value.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
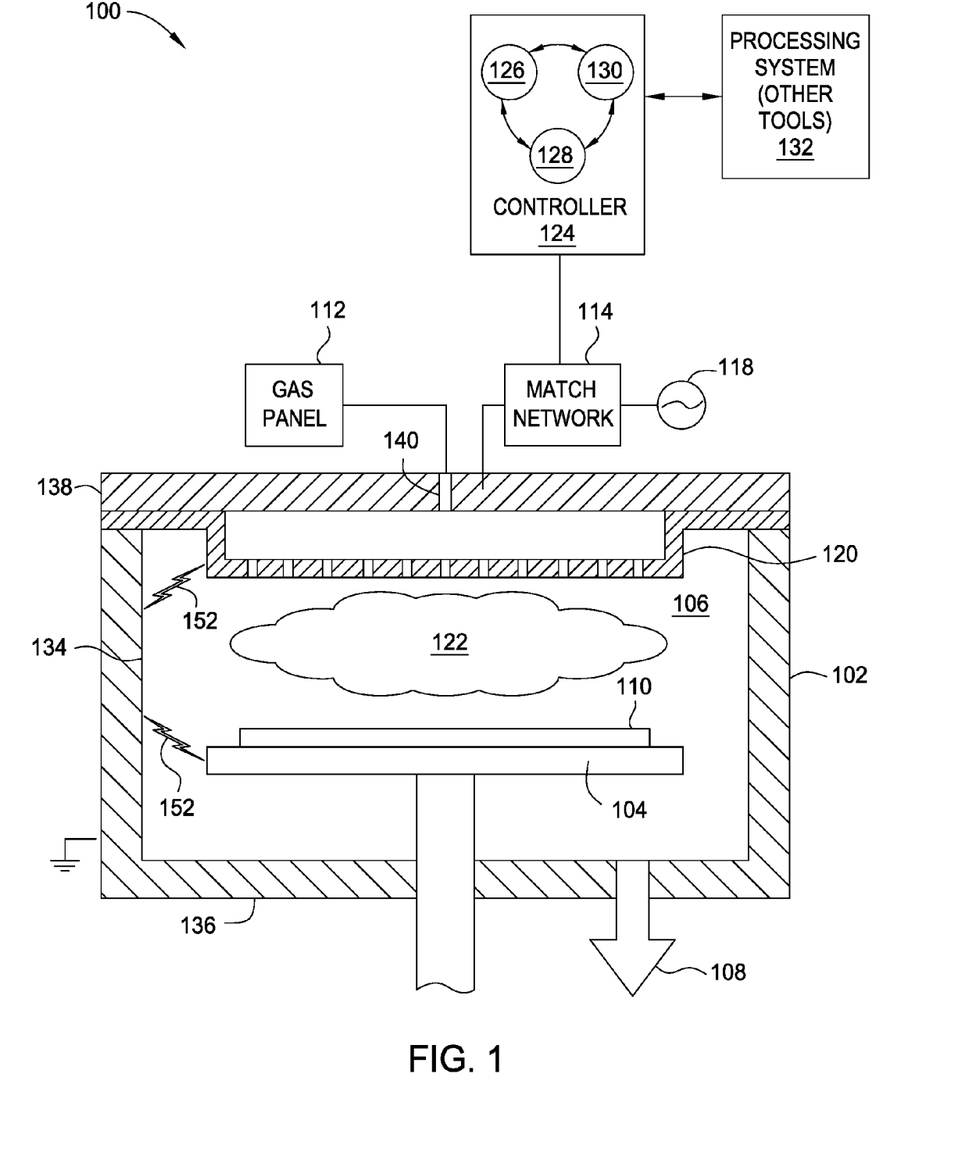
FIG. 1 schematic, cross-sectional view of a PECVD apparatus chamber that may be used to perform the methods described herein.

FIG. 1 is a schematic, cross sectional view of a plasma enhanced chemical vapor deposition (PECVD) apparatus that may be used to perform the operations described herein. The apparatus includes a processing chamber 100 in which one or more films may be deposited onto a substrate 110. The processing chamber 100 includes a chamber body 102 and a lid 138 which enclose an interior volume 106. The chamber body 102 is typically fabricated from aluminum, stainless steel, or other suitable material. The chamber body 102 generally includes sidewalls 134 and a bottom 136. A substrate support pedestal access port (not shown) is generally defined in a sidewall 134 and a selectively sealed by a slit valve to facilitate entry and egress of a substrate 110 from the processing chamber 100. An exhaust port is defined in the chamber body 102 and couples the interior volume 106 to a pump system 108. The pump system 108 generally includes one or more pumps and throttle valves utilized to evacuate and regulate the pressure of the interior volume 106 of the processing chamber 100.

A substrate support 104 (i.e., a pedestal assembly) is disposed in the interior volume 106 of the processing chamber 100 below a gas distribution (showerhead) assembly 120. The substrate support 104 holds the substrate 110 during processing. The substrate support 104 generally includes a plurality of lift pins (not shown) disposed therethrough that are configured to lift the substrate 110 from the substrate support 104 and facilitate exchange of the substrate 110 with a robot (not shown) in a conventional manner. The substrate support 104 also includes heating and/or cooling elements (not shown) to maintain the substrate support 104 at a desired temperature, and RF return straps (also not shown) to provide an RF return path to the chamber body 102 at the periphery of the substrate support 104.

A gas panel 112 is coupled to the processing chamber 100 to provide process and/or cleaning gases to the interior volume 106. In the example depicted in FIG. 1, inlet ports 140 are provided in the lid 138 to allow gases to be delivered from the gas panel 112 to the interior volume 106 of the processing chamber 100. Optionally, a remote plasma source may be optionally coupled to the gas panel 112 to facilitate dissociating gas mixture from a remote plasma prior to entering into the interior volume 106 for processing.

The showerhead assembly 120 is coupled to an interior surface of the lid 138. The showerhead assembly 120 includes a plurality of apertures that allow the gases flowing through the showerhead assembly 120 from the inlet ports 140 into the interior volume 106 of the processing chamber 100 in a predefined distribution across the surface of the substrate 110 being processed in the processing chamber 100.

RF power provided from an RF power source 118 is coupled through a matching network 114 to the showerhead assembly 120. The RF power source 118 typically is capable of producing up to about 3000 W of RF power at a tunable frequency in a range from about 50 kHz to about 200 MHz.

In one mode of operation, the substrate 110 is disposed on the substrate support 104 in the plasma processing chamber 100. A process gas and/or gas mixture 122 is introduced into the chamber body 102 through the showerhead assembly 120 from the gas panel 112. A vacuum pump system 108 maintains the pressure inside the chamber body 102 while removing deposition by-products.

A controller 124 is coupled to the processing chamber 100 to control operation of the processing chamber 100 and coordinate with other tools 132 tools in the system, which are operatively connected to the processing chamber 100. The controller 124 includes a central processing unit (CPU) 126, a memory 128, and a support circuit 130 utilized to control the process sequence and regulate the gas flows from the gas panel 112. The CPU 126 may be any form of general purpose computer processor that may be used in an industrial setting. A software routine or a series of program instructions are stored in the memory 128, such as random access memory, read only memory, floppy, or hard disk drive, or other form of digital storage. The support circuit 130 is conventionally coupled to the CPU 126 and may include cache, clock circuits, input/output systems, power supplies, and the like. Bi-directional communications between the controller 124 and the various components of the processing chamber 100 are handled through numerous signal cables. One example of a controller 124 which may be adapted to control the operations of the processing chamber 100 in accordance with the disclosure is the Advanced Process Control (APC) E3™ statistical process control module made available by Applied Materials, Inc., of Santa Clara, Calif.

As discussed above, when a substrate is broken or a severe arc occurs, the substrate often has to be scrapped. For example, during operation of the processing chamber 100, unintended arc discharge (depicted as arcs 152) may occur within the interior volume 106, such as between the sidewalls 134 and the showerhead assembly 120, or between the sidewalls 134 and the substrate support 104. In other cases, particularly in cases where the substrate is comprised of glass, the substrate 110 within the processing chamber 100 may suffer breakages or be otherwise damaged during handling and/or processing within the chamber.

Figure 2:
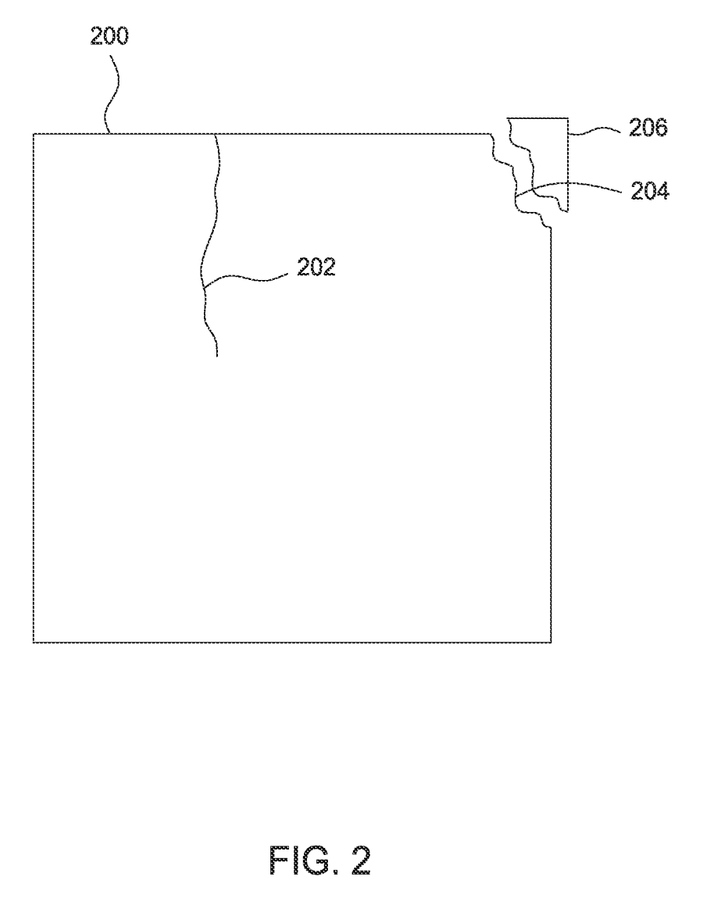
FIG. 2 is a plan view of a substrate having breakages.

FIG. 2 is a plan view of a substrate 200 depicted with examples of glass breakages 202, 204. The glass breakage 204 represents damage to an edge of the substrate 200 such that a piece of glass 206 may chip or fall off the substrate 200. The glass breakage 202 represents an internal crack (e.g., covering 20%-30% of the substrate) which may also result in shards or specks of glass separating from the substrate 200. Depending how a breakage occurs, a small piece of glass could be left behind in the processing chamber 100 without being detected. Having small pieces of glass disposed in the processing chamber may result in one or more subsequently processed substrates being damaged by the small pieces of glass potentially resulting in the substrate being discarded. Furthermore, should some small pieces of glass be carried out of the processing chamber 100 and into the transfer chamber during transfer of the substrate 200, contamination and damage to substrate being processed in other tools 132 of the system become at risk, thereby potentially requiring the entire system to be shut down for cleaning.

Similarly, depending on the severity of the arc, a small area of the substrate support 104, showerhead assembly 120, or other component within the chamber could generate particles, which become a source of substrate contamination, in addition to the need to replace the damaged chamber component. Particle contamination and replacement of damage chamber components are a significant contributors to yield loss and lost production time. As such, glass breakage and arcing results in tool downtime, loss of production, and wasted materials (scrap).

According to one or more embodiments, the controller 124 is configured to collect chamber data, e.g., parameters such as RF signals, voltages, and other electrical parameters, during operation of the processing chamber 100, and analyze the chamber data for abnormal spikes and trends. Using such data mining and analysis, embodiments provide a method to detect broken substrates without relying on glass presence sensors on robots, chamber components, or tool faults, but rather based on chamber data. Armed with this data, embodiments of the present disclosure are able to stop processing when broken glass or arcing is detected and thus avoiding furthering shattering of glass in the processing chamber and the transfer chamber, which brings the whole system down. Thus, embodiments are able to continue processing substrates on the rest of the system while cleaning one of the processing chambers rather than have the entire system down (because of glass in the transfer chamber.)

In operation, a plasma environment is initiated and maintained in the processing chamber 100. The substrate 110 acts as a dielectric and the paths of ions and electrons are determined in the chamber 100 for a specific RF power delivery. These paths through the chamber 100 eventually define the chamber impedance. If an arc happens on the substrate 110, then new paths are formed (a number of the paths reaching the susceptor directly without going through the substrate 110). The latter paths can lead to a modified chamber impedance. The different in impedance is tracked to identify arcing. In extreme situations, if the arcing is severe, the chamber anodization can be affected locally and "burn" marks appear on the chamber 100 (e.g., substrate support, showerhead, shadowframe). The arcing can potentially lead to yield loss for any subsequently-processed substrates. The described algorithm tracks the evolution of RF parameters and thus the impedance during deposition in the processing chamber 100 through a time window. For example, the deposition and power lift processes may be monitored. The described algorithm scans historical data for the same deposition recipe for the given chamber and compares to a time weighted average. Limits are then set up based on a review of the historical data, which allows for soft limits that depend on the chamber's condition. When limits are exceeded, a notification in the form of an alert (e.g., e-mail, text, phone call, visual signal, audio signal and the like) can be sent to the engineers with notification of a problem in the processing chamber.

In one embodiment, the controller 124 is configured to monitor RF-related data items, such as a frequency and load of RF signal, a bias voltage (i.e., $V_{DC}$), a peak-to-peak voltage load (i.e., $V_{PP}$), reflected power, and forward power. Other chamber parameters may be monitored. The controller 124 may obtain these data items by monitoring the matching network 114, which attempts to match the impedance between the RF power source 118 and the processing chamber 100.

Figure 3:
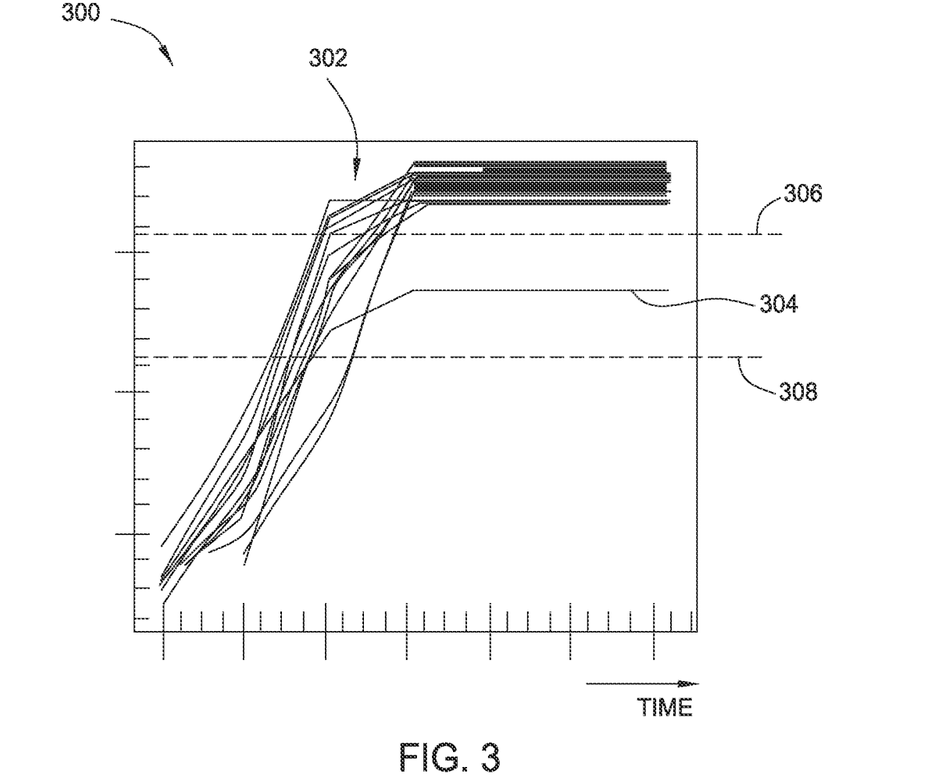
FIGS. 3 and 4 are charts depicting chamber parameters received during operation of the PECVD chamber in accordance with embodiments of the present disclosure.

FIG. 3 is a chart 300 depicting a chamber parameter received during operations of the processing chamber 100 in accordance with embodiments of the present disclosure. The chart 300 depicts a value of a chamber parameter obtained by the controller 124 over time, across multiple, repeated runs of the processing chamber 100. Graphs 302 represent historical values of the chamber parameter from past processing runs. In one embodiment, the controller 124 may generate a signature of the chamber parameter based on the historical data. For example, the signature of the chamber parameter may be a time weighted average or an estimated trend of the historical data, which may change over time.

Deviations from the signature of the chamber parameter are determined to be indicative of glass breakage or an arcing event, and may be enforced using threshold values. Multiple levels of threshold values may be used. In one embodiment, the controller 124 may determine a first (warning) threshold 306, which represents a significant deviation from the historical data, and a second (fault) threshold 308, which represents a greater deviation from the historical data.

Chart 300 includes a graph 304 represents the value of the chamber parameter over time during a particular processing run. As shown in FIG. 3, the chamber parameter in graph 304 has deviated from the historical values (i.e., graphs 302) such that the value of graph 304 has at least cleared the fault threshold 308 but has failed to clear the warning threshold 306. As described later, the warning threshold 306 and the fault threshold 308 may trigger a corresponding action, such as an alert or a remedial action (e.g., halting the process).

For example, chart 300 may represent the value of the RF signal frequency during operation of the chamber 100. Multiple chamber parameters may be monitored for changes from their normal trend whenever a substrate was broken or an arcing event occurred, and it may be determined that changes in the frequency signal from the normal trend (i.e., graph 302) are commonly found in arcing events. As such, detecting a deviation in signal frequency from the normal trend, as seen in graph 304, may signify the substrate 110 within the chamber 100 has exhibited arcing.

In one embodiment, the thresholds (i.e., warning threshold 306 and fault threshold 308), which may be interchangeably referred to as limits, may be static values of a chamber parameter determined based on the historical data for that chamber parameters. In other embodiments, the thresholds may be a deviation value relative to the signature of the chamber parameter, i.e., a function over time. In some embodiments, the thresholds may be fixed values or may be gradually adjusted over time to compensate for gradually changing conditions within the processing chamber 100.

Figure 4:
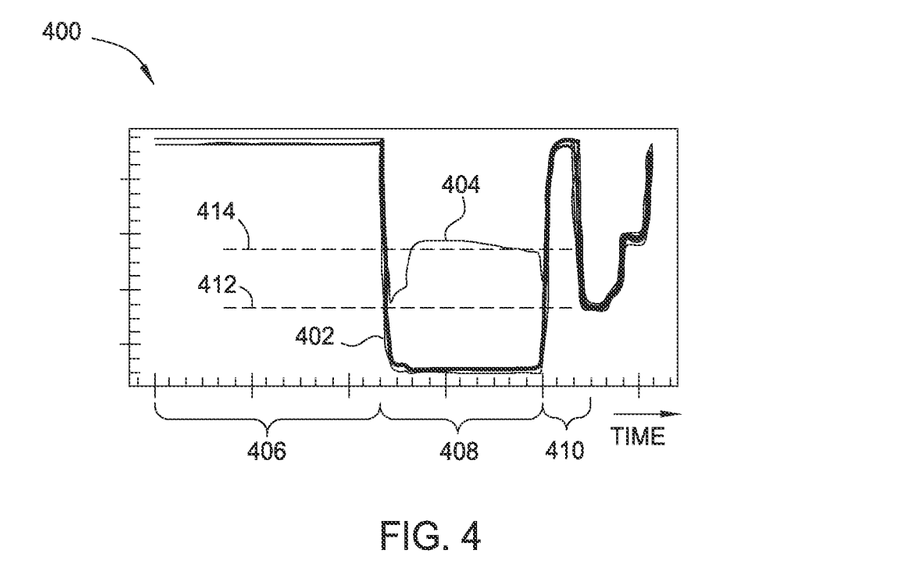

FIG. 4 is another chart 400 depicting a chamber parameter received during operations of the processing chamber 100 in accordance with embodiments of the present disclosure. Similar to the chart 300, the chart 400 depicts a value of a chamber parameter obtained by the controller 124 over time across repeated runs of the processing chamber 100. Graphs 402 represent historical values of the chamber parameter from processing runs. Graph 404 represents the value of the chamber parameter over time during a particular processing run, in which the monitored chamber parameter deviated from the historical values.

Chart 400 further depicts that operation of the processing chamber 100 typically includes different stages of a recipe (depicted as stages 406, 408, 410), during which the value of the monitored chamber parameter may vary widely depending on the particular recipe stage being performed and its interaction with the substrate. For example, as shown in FIG. 4, during stage 406 or in stage 410, the graph 404 does not deviate significantly from the historical graphs 402. However, during the stage 408, the chamber parameter in graph 404 has deviated from the historical values (i.e., graphs 404) such that the value of graph 404 has exceeded both a warning limit 412 and a fault limit 414.

As such, in one or more embodiments, the controller 124 may determine a threshold associated with a particular chamber parameter and further associated with a particular recipe stage, such as the deposition or power lift stages of a recipe. In this way, the controller 124 may be configured to identify deviations from historical data on a per-recipe-stage basis, rather than simply comparing the bias voltage averaged across the entire run of the processing chamber. For example, using data mining and comparing the signature of arcing to that of a non-arcing chamber for the whole recipe, it has been determined that $V_{DC}$ and RF frequency signal are strong indicators of arcing, although other chamber parameters may be used. As such, the controller 124 might determine a threshold value for a bias voltage (i.e., $V_{DC}$) parameter during the deposition stage of a recipe, according to historical values for the bias voltage during the past deposition stages. $V_{DC}$ trending data may be used to check for one-time arcing events or for multiple arcs, the latter of which can be an indication that the chamber state has deteriorated and may need to be opened for further inspection.

While FIG. 4 depicts stages 406, 408, 410 of a recipe, it should be recognized that other windows of time may be used to segment trends of the historical chamber data. For example, rather than use the pre-determined timing of the recipe stages, the controller 124 may identify other windows of time during the operation of the processing chamber in which to correlate the historical trend data of a chamber parameter with different threshold levels. These identified windows of time may be shorter or longer in duration than the recipe stages, and may span multiple recipe stages or be limited within a recipe stage.

Figure 5:
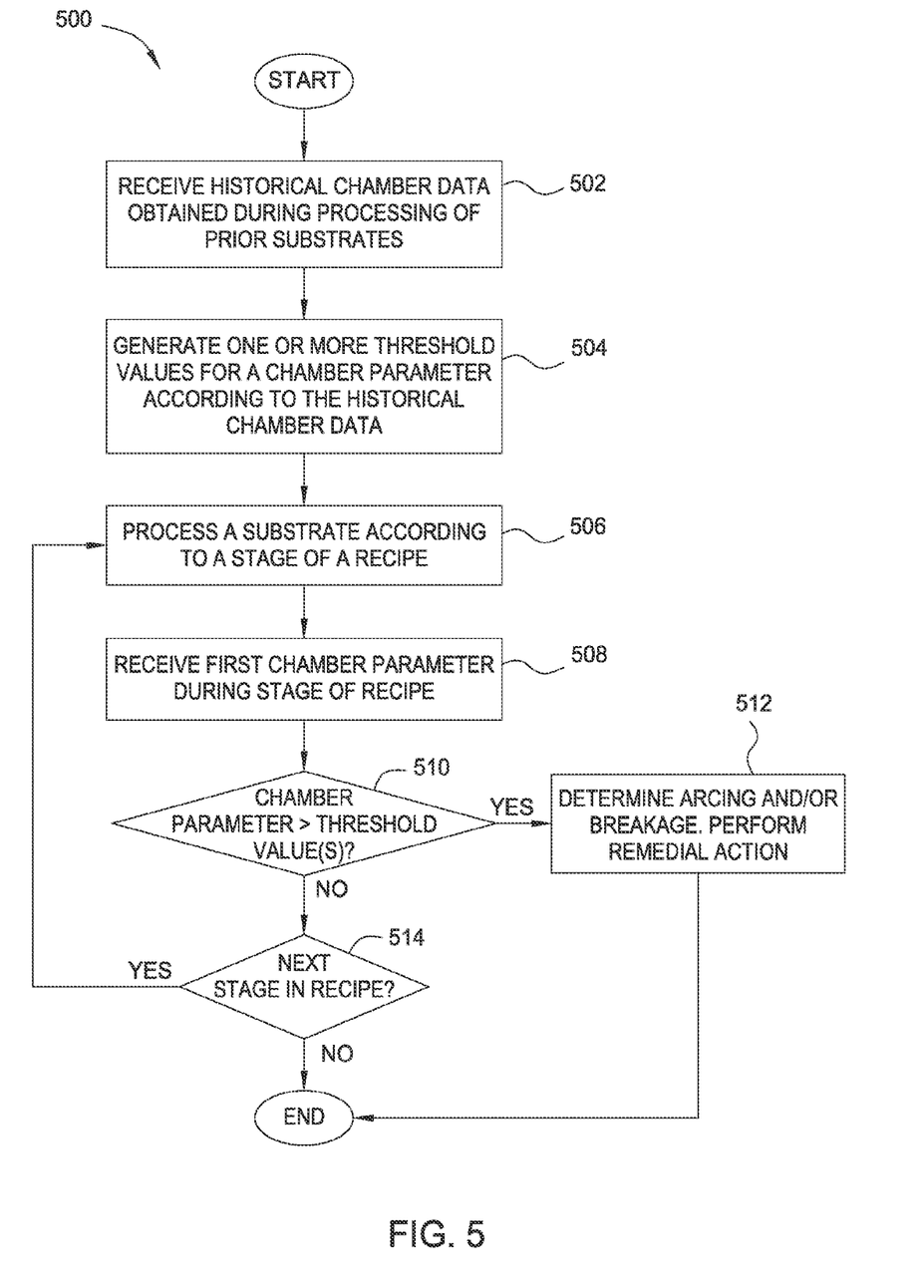
FIG. 5 is a flow diagram of a method for detecting breakages and arcing while operating the PECVD chamber in accordance with one embodiment of the present disclosure.

FIG. 5 is a flow diagram of a method 500 for detecting breakages and/or arcing while operating the processing chamber 100 in accordance with one embodiment of the present disclosure. While the method 500 is described as being performed by the processing chamber 100 of FIG. 1, it should be recognized that other embodiments and other processing chambers and systems may be utilized to perform the described method.

The method 500 begins at stage 502, in which the controller 124 receives and/or accesses a plurality of historical chamber data obtained during processing of prior substrates. In one embodiment, the controller 124 accumulates the historical chamber data during prior runs of the same processing chamber 100 or other similar chambers. The chamber data may include an applied RF power ($P_{RF}$), applied RF signal frequency, a bias voltage ($V_{DC}$), a peak-to-peak voltage ($V_{PP}$) of the applied oscillating voltage, output power of the RF power source 118 (also called incident or forward power), power reflected back to the RF power source 118 by the match network 114 (i.e., reflected power), and other chamber parameters. In some embodiments, the controller 124 may obtain these data points as a function of time of processing by the chamber 100.

At stage 504, the controller 124 may generate one or more threshold values for a chamber parameter according to the historical chamber data. The threshold values represent deviations from the historical chamber data which signify that there is a breakage in the substrate 110 or that arcing has occurred within the processing chamber 100. In one embodiment, the controller 124 may generate a signature of the historical chamber data comprising a trend for the chamber parameter during an associated stage in the recipe, and set one or more threshold deviations from that trend. In some embodiments, multiple threshold values may be generated to represent different levels, including a "warning" threshold, a "fault" threshold, and other levels. Threshold values may be absolute numeric values (e.g., in units of kW, MHz) or may be in relative terms such as percentage change (e.g., 20%).

At stage 506, the processing chamber 100 may process a substrate according to a stage of a recipe. In one embodiment, the controller 124 transmits control signals to one or more components of the system (e.g., the gas panel 112, the RF power source 118, substrate support 104) according to input parameters associated with that stage in the recipe. For example, the stage in the recipe might call for a particular amount of power to be applied to the plasma formed with the processing chamber 100. At stage 508, the controller 124 receives a first chamber parameter during the stage of the recipe.

At stage 510, the controller 124 determines whether the first chamber parameter exceeds the threshold value. In some embodiments, the controller 124 determines the first chamber parameter exceeds the threshold value by dint of having a value that is greater than the threshold value. In other embodiments, the controller 124 determines the first chamber parameter "exceeds" the threshold value if the chamber parameter value deviates from the trend of the chamber parameter by an amount that exceeds the threshold value.

At stage 512, responsive to determining that the received chamber parameter exceeds the threshold value, the controller 124 determines an anomalous event has occurred within the processing chamber 100 (e.g., breakage in the substrate 110, arcing) and performs one or more remedial actions. In some cases, depending on the chamber parameter that deviated, and depending on what stage in the recipe, the anomalous event may be a breakage in the substrate 110, while in other cases, the anomalous event may be arcing within the chamber 100. For example, the controller 124 may determine that a breakage exists in the substrate 110 based on a determination that the RF signal frequency has deviated from the historical RF signal frequency by a threshold amount. In another example, the controller 124 may determine that an arcing event has occurred based on a determination that the bias voltage level has deviated during deposition from the historical trending $V_{DC}$ by a threshold amount.

In embodiments having multiple levels of threshold values, the controller 124 may perform a remedial action associated with the threshold level exceeded. In some embodiments, responsive to determining that the received chamber parameter has exceeded a warning threshold value, the controller 124 may transmit an alert to one or more users (e.g., engineers, technicians, and the like) notifying of a problem with the chamber. For example, the controller 124 may transmit an alert in the form of an e-mail message or a text message to the user operating the processing chamber 100. Other alerts may include phone call, visual signal, audio signal and the like. In some embodiments, responsive to determining that the received chamber parameter has exceeded a fault threshold value, the controller 124 may shut down the recipe and further operations of the chamber 100 to prevent greater damage to the chamber parts.

In one embodiment, the controller 124 may halt operations of the processing chamber 100 in response to determining that the chamber parameter exceeds the threshold value thus signifying a substrate breakage. In some cases, the controller 124 may transmit a command to stop operation of the processing chamber only (but allow other tools 132 to continue operations). This allows the system to work around the halted processing chamber 100, for example, by employing backup chambers. In other cases, the controller 124 may transmit a command to stop operation of all tools, including the processing chamber 100 and other tools 132 within the system, for example in cases where the ongoing process is a critical one. Other types, and in other combinations, of remedial actions may be taken.

At stage 514, responsive to determining that the received chamber parameter has not exceeded the threshold value, the controller 124 may determine whether there are additional stages in the recipe to be performed. If so, the controller 124 proceeds to stage 506 and processes the substrate according to the next stage of the recipe. In some embodiments, the controller 124 may re-evaluate the threshold values by incorporating the received chamber parameter from the just-finished recipe stage. As such, the controller 124 is able to gradually change the threshold values which allows for adjustment to the current chamber condition.

Embodiments of the present disclosure may be found in the following examples:

Example 1

A method for operating a processing chamber, the method comprising
a) receiving historical chamber data obtained during processing of prior substrates in the processing chamber;
b) generating a threshold value associated with a first chamber parameter according to the historical chamber data;
c) receiving the first chamber parameter during processing of a first substrate according to a step of a recipe; and
d) determining a breakage exists in the first substrate in response to determining the first chamber parameter exceeds the threshold value.

Example 2

The method of Example 1, further comprising:
a) generating a time-weighted average of the historical chamber data for the first chamber parameter, wherein the threshold value associated with the first chamber parameter comprises an amount of deviation from the time-weighted average.

Example 3

The method of Example 1, further comprising:
a) responsive to determining the breakage exists in the first substrate, halting operations of the processing chamber and one or more tools operatively connected to the processing chamber.

Example 4

The method of Example 1, further comprising:
a) responsive to determining the breakage exists in the first substrate, halting operations of the processing chamber only.

Example 5

The method of Example 1, further comprising:
a) responsive to determining the breakage exists in the first substrate, transmitting an alert to a user notifying the user of the breakage.

Example 6

The method of Example 1, wherein the step of the recipe comprises at least one of a deposition step and a power lift step of the recipe.

Example 7

The method of Example 1, wherein the first chamber parameter comprises radio frequency (RF) signal data.

Example 8

A method for operating a processing chamber, the method comprising:
a) receiving historical chamber data obtained during processing of prior substrates in the processing chamber;
b) generating a threshold value associated with a first chamber parameter according to the historical chamber data;
c) receiving the first chamber parameter during processing of a first substrate according to a step of a recipe; and
d) determining arcing has occurred between the processing chamber and the first substrate in response to determining the first chamber parameter exceeds the threshold value.

Example 9

The method of Example 8, further comprising:
a) generating a time-weighted average of the historical chamber data for the first chamber parameter, wherein the threshold value associated with the first chamber parameter comprises an amount of deviation from the time-weighted average.

Example 10

The method of Example 8, further comprising:
a) responsive to determining the arcing has occurred between the processing chamber and the first substrate, transmitting an alert to a user notifying the user of the arcing.

Example 11

The method of Example 8, further comprising:
a) responsive to determining the arcing has occurred between the processing chamber and the first substrate, halting operations of the processing chamber and one or more tools operatively connected to the processing chamber.

Example 12

The method of Example 8, further comprising:
a) responsive to determining the arcing has occurred between the processing chamber and the first substrate, halting operations of the processing chamber only.

Example 13

The method of Example 8, wherein the step of the recipe comprises at least one of a deposition step and a power lift step of the recipe.

Example 14

The method of Example 8, wherein the first chamber parameter comprises at least one of self bias voltage and radio frequency (RF) signal data.

Example 15

A controller for a processing chamber, the controller comprising a system memory and a processor programmed to carry out the steps of:
a) receiving historical chamber data obtained during processing of prior substrates in the processing chamber;
b) generating a threshold value associated with a first chamber parameter according to the historical chamber data;
c) receiving the first chamber parameter during processing of a first substrate according to a step of a recipe; and
d) determining arcing has occurred between the processing chamber and the first substrate in response to determining the first chamber parameter exceeds the threshold value.

Example 16

The controller of Example 15, wherein the processor is further programmed the carry out the steps of:
a) generating a time-weighted average of the historical chamber data for the first chamber parameter, wherein the threshold value associated with the first chamber parameter comprises an amount of deviation from the time-weighted average.

Example 17

The controller of Example 15, wherein the processor is further programmed the carry out the steps of:
a) responsive to determining the arcing has occurred between the processing chamber and the first substrate, transmitting an alert to a user notifying the user of the arcing.

Example 18

The controller of Example 15, wherein the processor is further programmed the carry out the steps of:
a) responsive to determining the arcing has occurred between the processing chamber and the first substrate, transmitting an alert to a user notifying the user of the arcing.

Example 19

The controller of Example 15, wherein the step of the recipe comprises at least one of a deposition step and a power lift step of the recipe.

Example 20

The controller of Example 15, wherein the first chamber parameter comprises at least one of self bias voltage and radio frequency (RF) signal data.

While the foregoing is directed to embodiments of the present disclosure, other and further embodiments of the disclosure may be devised without departing from the basic scope thereof, and the scope thereof is determined by the claims that follow.

What is claimed is:

1. A method for operating a deposition chamber, the method comprising:
   generating a threshold value associated with a first chamber parameter according to historical chamber data obtained during processing of prior substrates in the deposition chamber;
   monitoring a RF match network for the first chamber parameter;
   receiving the first chamber parameter from the match network during processing of a first substrate according to a stage of a recipe; and
   determining at least one of a breakage exists in the first substrate or arcing has occurred in the deposition chamber while processing the first substrate in response to determining the first chamber parameter exceeds the threshold value.

2. The method of claim 1, further comprising:
   generating a time-weighted average of the historical chamber data for the first chamber parameter, wherein the threshold value associated with the first chamber parameter comprises an amount of deviation from the time-weighted average.

3. The method of claim 1, further comprising:
   responsive to determining the first chamber parameter exceeds the threshold value, halting operations of the deposition chamber and one or more tools operatively connected to the deposition chamber.

4. The method of claim 1, further comprising:
   responsive to determining the first chamber parameter exceeds the threshold value, halting operations of the deposition chamber only.

5. The method of claim 1, further comprising:
   responsive to determining the first chamber parameter exceeds the threshold value, transmitting an alert to a user.

6. The method of claim 1, wherein the stage of the recipe comprises at least one of a deposition stage and a power lift stage of the recipe.

7. The method of claim 1, wherein the first chamber parameter comprises radio frequency (RF) signal data.

8. The method of claim 1, wherein the first chamber parameter further comprises:
   one or more of a RF frequency, RF load, reflected power, forward power.

9. A computer-readable storage medium storing a program, which, when executed by a processor performs an operation for operating a deposition chamber, the operation comprising:
   generating a threshold value associated with a first chamber parameter according to historical chamber data obtained during processing of prior substrates in the deposition chamber;
   monitoring a RF match network for the first chamber parameter;
   receiving the first chamber parameter from the RF match network during processing of a first substrate according to a stage of a recipe; and
   determining at least one of a breakage exists in the first substrate or arcing has occurred in the deposition chamber while processing the first substrate in response to determining the first chamber parameter exceeds the threshold value.

10. The computer-readable storage medium of claim 9, wherein the operation further comprises:
    generating a time-weighted average of the historical chamber data for the first chamber parameter, wherein the threshold value associated with the first chamber parameter comprises an amount of deviation from the time-weighted average.

11. The computer-readable storage medium of claim 9, wherein the operation further comprises:
    responsive to determining the arcing has occurred between the deposition chamber and the first substrate, transmitting an alert to a user notifying the user of the arcing.

12. The computer-readable storage medium of claim 9, wherein the operation further comprises:
    responsive to determining the arcing has occurred between the deposition chamber and the first substrate, halting operations of the deposition chamber and one or more tools operatively connected to the deposition chamber.

13. The computer-readable storage medium of claim 9, wherein the operation further comprises:
    responsive to determining the arcing has occurred between the deposition chamber and the first substrate, halting operations of the deposition chamber only.

14. The computer-readable storage medium of claim 9, wherein the stage of the recipe comprises at least one of a deposition stage and a power lift stage of the recipe.

15. The computer-readable storage medium of claim 9, wherein the first chamber parameter comprises at least one of self bias voltage and radio frequency (RF) signal data.

16. The computer-readable storage medium of claim 9, wherein the first chamber parameter further comprises:
    one or more of a RF frequency, RF load, reflected power, forward power.

17. A controller for a deposition chamber, the controller comprising a system memory and a processor programmed to carry out the stages of:
    receiving historical chamber data obtained during processing of prior substrates in the deposition chamber;
    generating a threshold value associated with a first chamber parameter according to the historical chamber data;
    monitoring a RF match network for the first chamber parameter;
    receiving the first chamber parameter from the match network during processing of a first substrate according to a stage of a recipe; and
    determining arcing has occurred between the deposition chamber and the first substrate in response to determining the first chamber parameter exceeds the threshold value.

18. The controller of claim 17, wherein the processor is further programmed the carry out the stages of:

generating a time-weighted average of the historical chamber data for the first chamber parameter, wherein the threshold value associated with the first chamber parameter comprises an amount of deviation from the time-weighted average.

19. The controller of claim 17, wherein the processor is further programmed the carry out the stages of:
responsive to determining the arcing has occurred between the deposition chamber and the first substrate, transmitting an alert to a user notifying the user of the arcing.

20. The controller of claim 17, wherein the processor is further programmed the carry out the stages of:
responsive to determining the arcing has occurred between the deposition chamber and the first substrate, halting operations of the deposition chamber and one or more tools operatively connected to the deposition chamber.

21. The controller of claim 17, wherein the stage of the recipe comprises at least one of a deposition stage and a power lift stage of the recipe.

22. The controller of claim 17, wherein the first chamber parameter comprises at least one of self bias voltage and radio frequency (RF) signal data.

23. The controller of claim 17, wherein the first chamber parameter further comprises:
one or more of a RF, RF load, reflected power, forward power.

* * * * *